(12) United States Patent
Chou et al.

(10) Patent No.: US 9,508,826 B2
(45) Date of Patent: Nov. 29, 2016

(54) REPLACEMENT GATE STRUCTURE FOR ENHANCING CONDUCTIVITY

(71) Applicant: GLOBALFOUNDRIES INC., Grand Cayman (KY)

(72) Inventors: Anthony I. Chou, Beacon, NY (US); Arvind Kumar, Chappaqua, NY (US); Sungjae Lee, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/307,575

(22) Filed: Jun. 18, 2014

(65) Prior Publication Data
US 2015/0372112 A1 Dec. 24, 2015

(51) Int. Cl.
*H01L 29/66* (2006.01)
*H01L 29/40* (2006.01)
*H01L 29/423* (2006.01)
(Continued)

(52) U.S. Cl.
CPC ... *H01L 29/66545* (2013.01); *H01L 21/02107* (2013.01); *H01L 21/283* (2013.01); *H01L 21/28132* (2013.01); *H01L 21/28158* (2013.01); *H01L 21/31111* (2013.01); *H01L 21/3205* (2013.01); *H01L 21/32133* (2013.01); *H01L 21/32139* (2013.01); *H01L 21/82345* (2013.01); *H01L 21/823431* (2013.01); *H01L 21/845* (2013.01); *H01L 29/401* (2013.01); *H01L 29/4232* (2013.01); *H01L 29/4238* (2013.01); *H01L 29/42356* (2013.01); *H01L 29/4958* (2013.01); *H01L 29/51* (2013.01); *H01L 29/517* (2013.01); *H01L 29/518* (2013.01); *H01L 29/6681* (2013.01); *H01L 29/66795* (2013.01); *H01L 29/785* (2013.01); *H01L 21/823821* (2013.01); *H01L 21/823842* (2013.01); *H01L 27/0886* (2013.01); *H01L 27/1211* (2013.01)

(58) Field of Classification Search
USPC .......................................................... 257/264
See application file for complete search history.

(56) References Cited

U.S. PATENT DOCUMENTS 8,421,077 B2   4/2013   Jain et al.
8,604,546 B1   12/2013  Bryant et al.
(Continued)

FOREIGN PATENT DOCUMENTS

WO   2011/087605 A2   7/2011

OTHER PUBLICATIONS

Notice of Allowance dated Jun. 6, 2016 received in U.S. Appl. No. 14/519,615.

*Primary Examiner* — Fernando L Toledo
*Assistant Examiner* — Valerie N Newton
(74) *Attorney, Agent, or Firm* — Scully, Scott, Murphy & Presser, P.C.

(57) ABSTRACT

After formation of a gate cavity straddling at least one semiconductor material portion, a gate dielectric layer and at least one work function material layer is formed over the gate dielectric layer. The at least one work function material layer and the gate dielectric layer are patterned such that remaining portions of the at least one work function material layer are present only in proximity to the at least one semiconductor material portion. A conductive material having a greater conductivity than the at least one work function material layer is deposited in remaining portions of the gate cavity. The conductive material portion within a replacement gate structure has the full width of the replacement gate structure in regions from which the at least one work function material layer and the gate dielectric layer are removed.

18 Claims, 15 Drawing Sheets

(51) Int. Cl.

| | | |
|---|---|---|
| *H01L 29/78* | (2006.01) | |
| *H01L 21/8234* | (2006.01) | |
| *H01L 29/49* | (2006.01) | |
| *H01L 21/28* | (2006.01) | |
| *H01L 21/02* | (2006.01) | |
| *H01L 21/283* | (2006.01) | |
| *H01L 21/311* | (2006.01) | |
| *H01L 21/3205* | (2006.01) | |
| *H01L 21/3213* | (2006.01) | |
| *H01L 29/51* | (2006.01) | |
| *H01L 21/84* | (2006.01) | |
| *H01L 27/088* | (2006.01) | |
| *H01L 21/8238* | (2006.01) | |
| *H01L 27/12* | (2006.01) | |

(56) References Cited

U.S. PATENT DOCUMENTS

| | | |
|---|---|---|
| 8,647,972 B1 | 2/2014 | Ando et al. |
| 9,281,192 B2 | 3/2016 | Liu et al. |
| 2005/0148137 A1* | 7/2005 | Brask et al. ............ 438/216 |
| 2008/0073723 A1* | 3/2008 | Rachmady et al. ...... 257/369 |
| 2013/0337618 A1 | 12/2013 | Han et al. |
| 2014/0065802 A1* | 3/2014 | Chang et al. ............ 438/479 |
| 2014/0217479 A1* | 8/2014 | Colinge et al. .......... 257/288 |

* cited by examiner

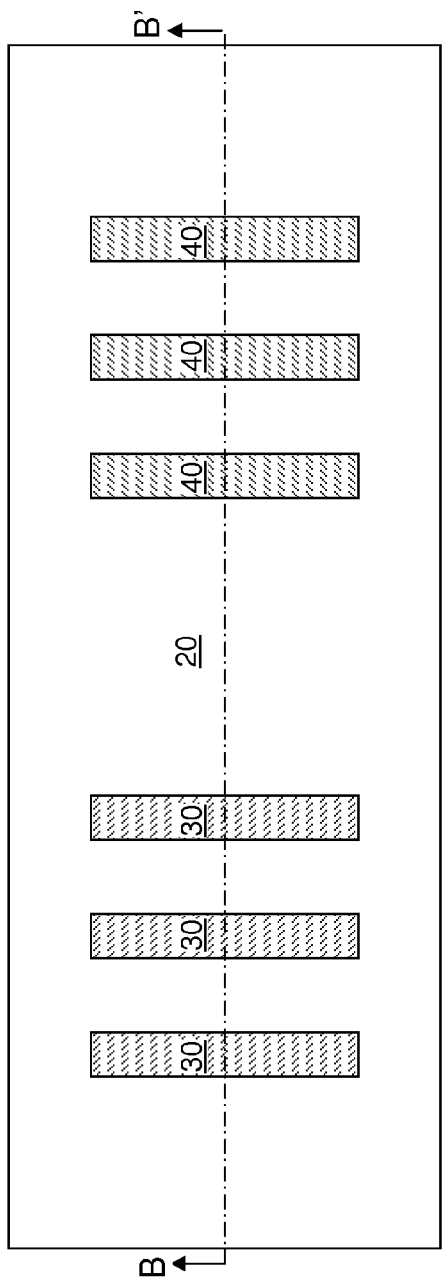
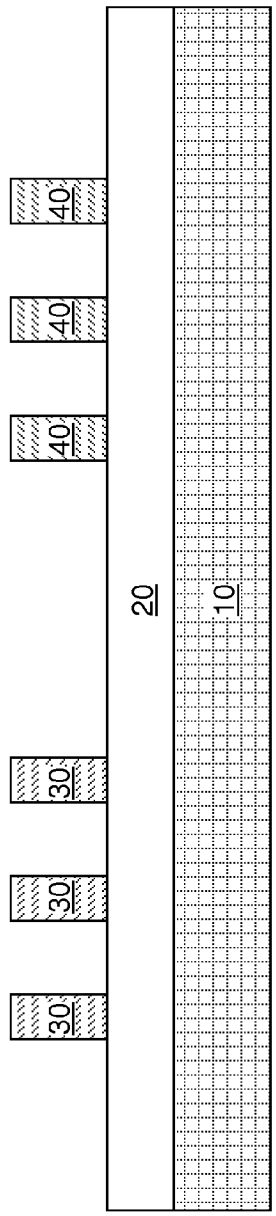

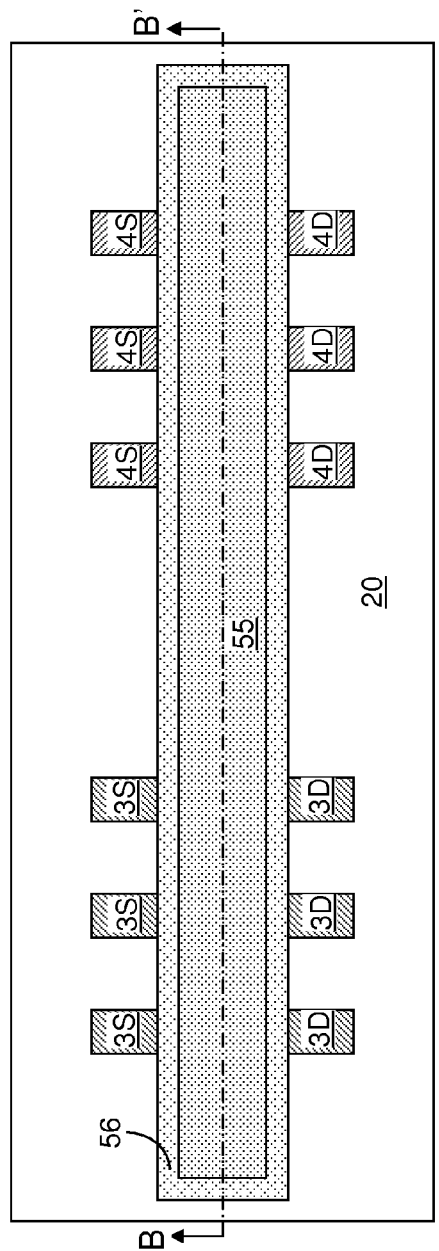
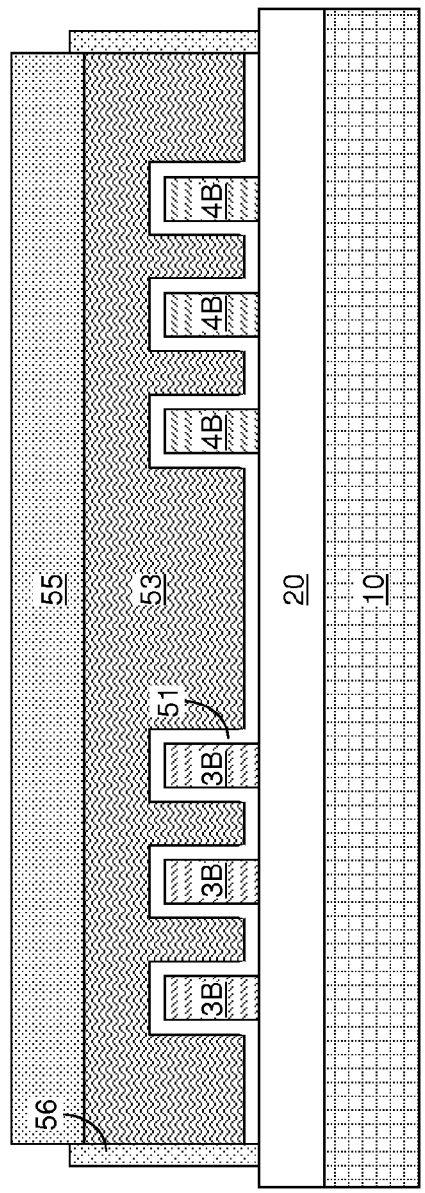
FIG. 2A
FIG. 2B

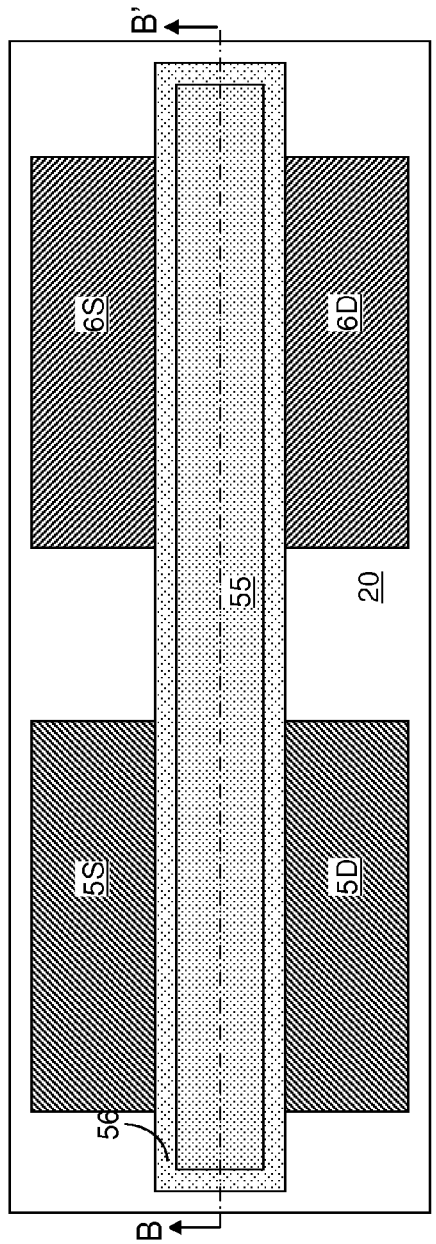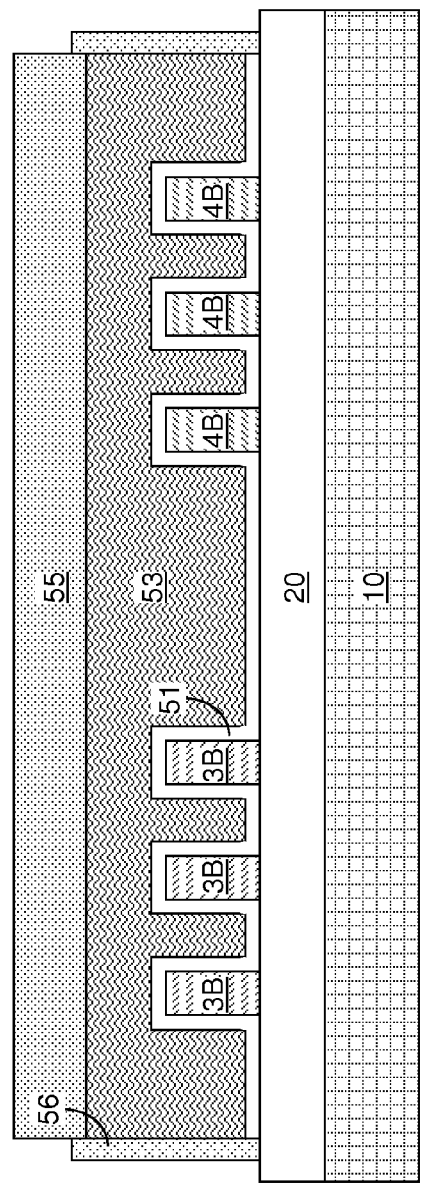

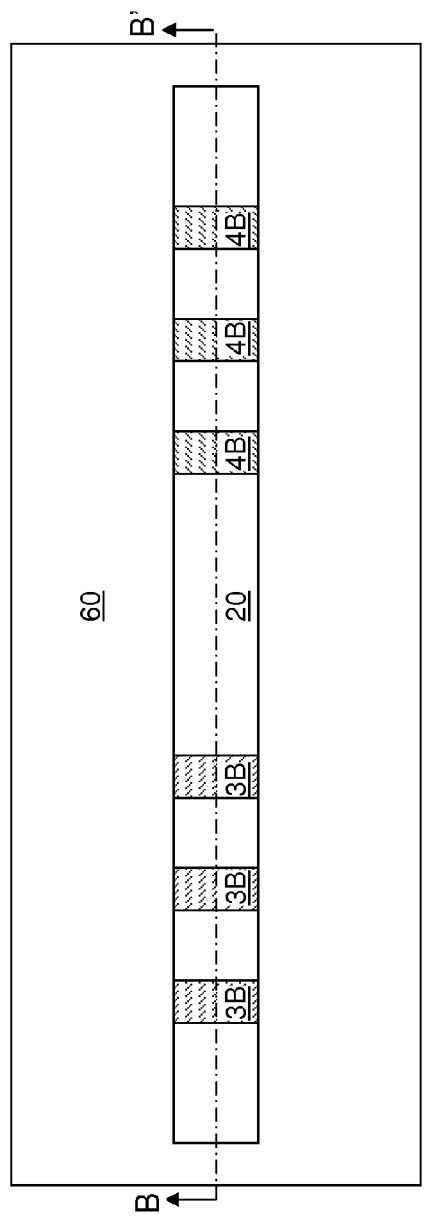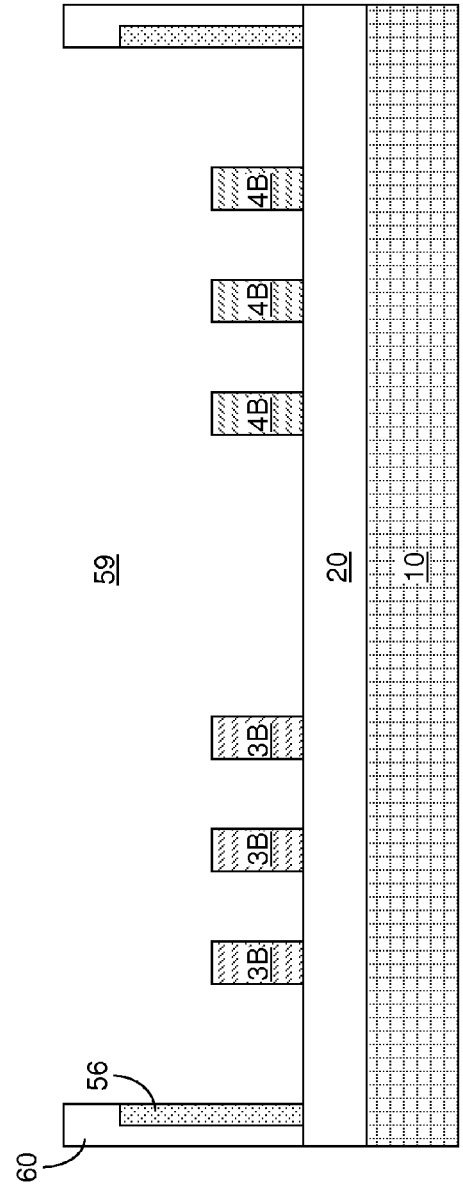
FIG. 5A
FIG. 5B

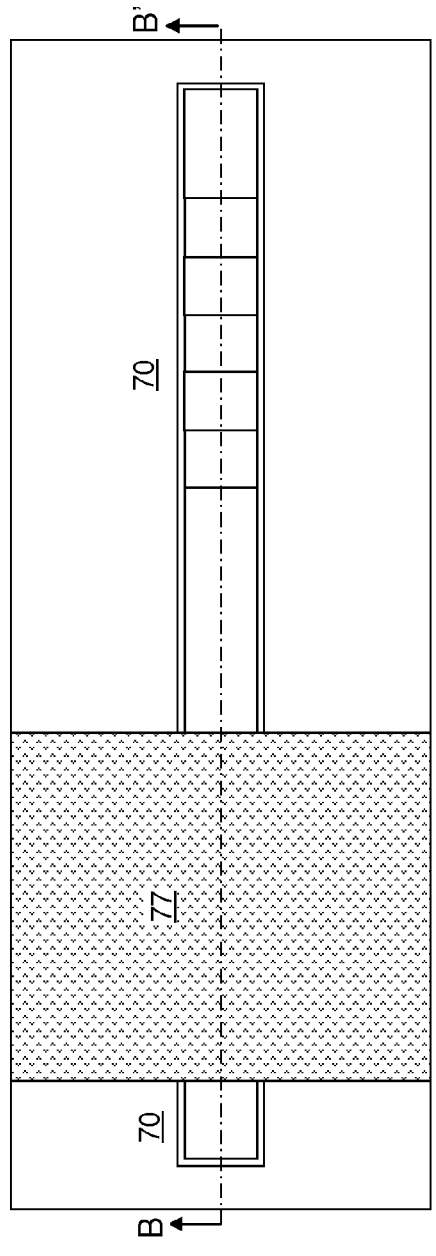
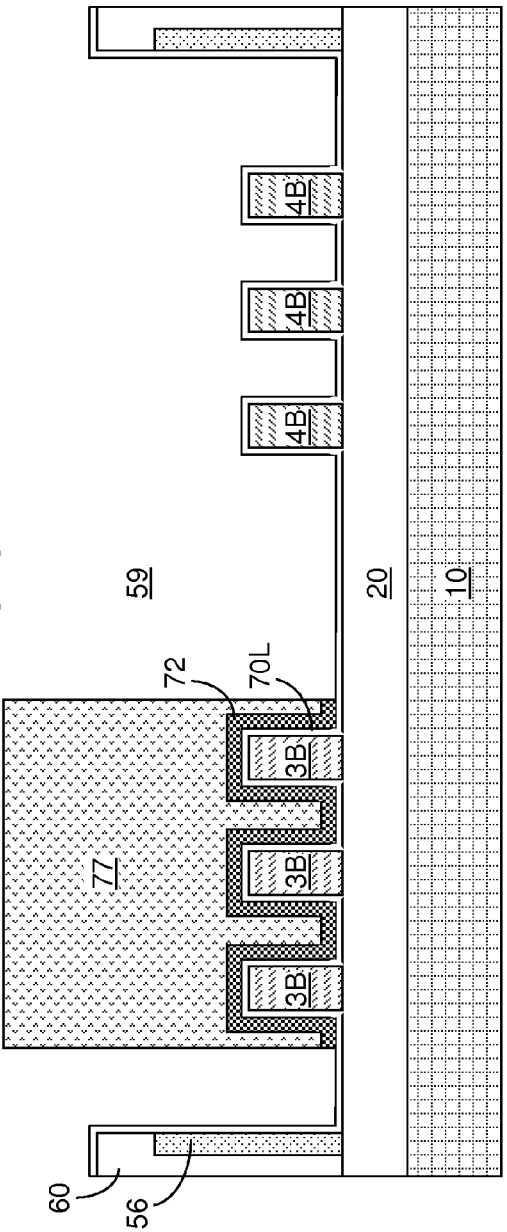
FIG. 8A
FIG. 8B

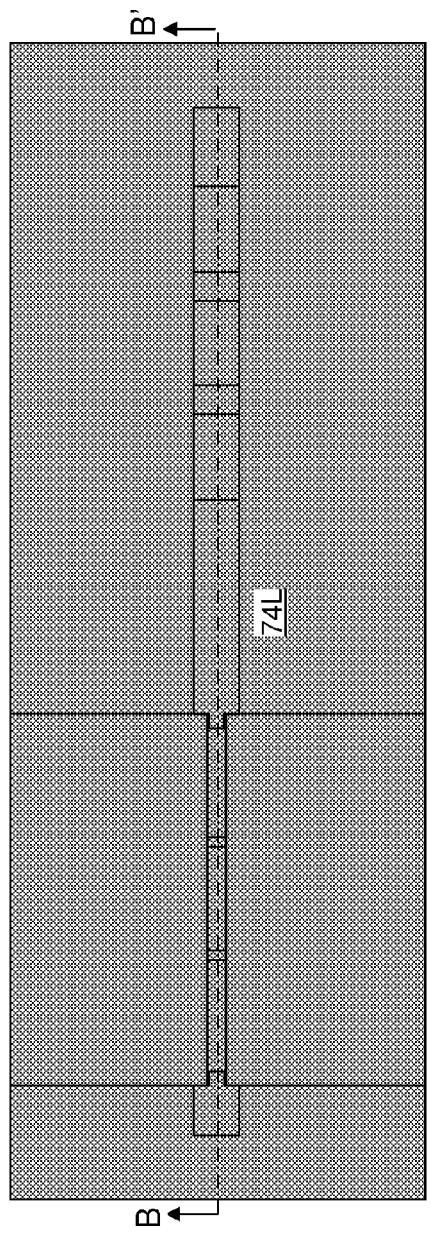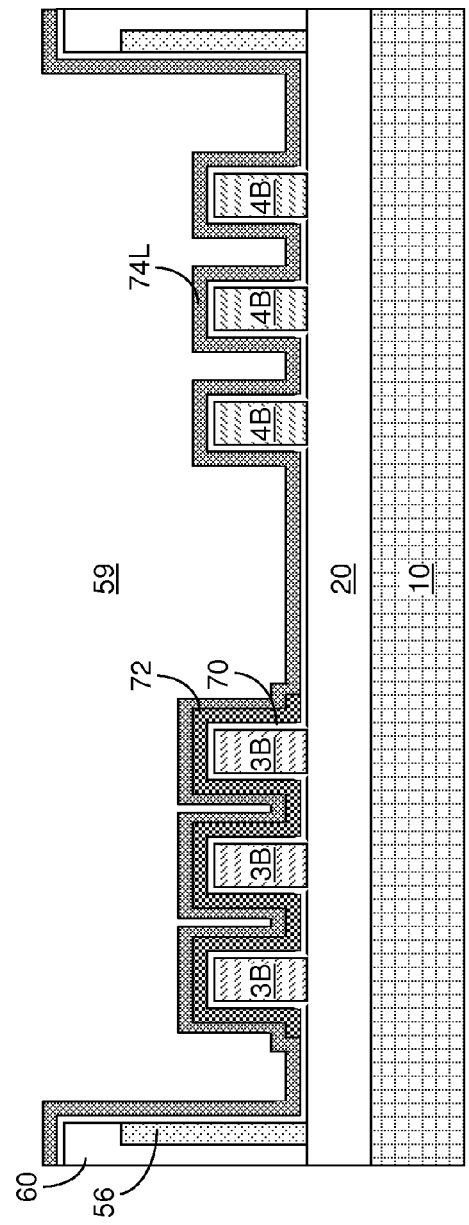

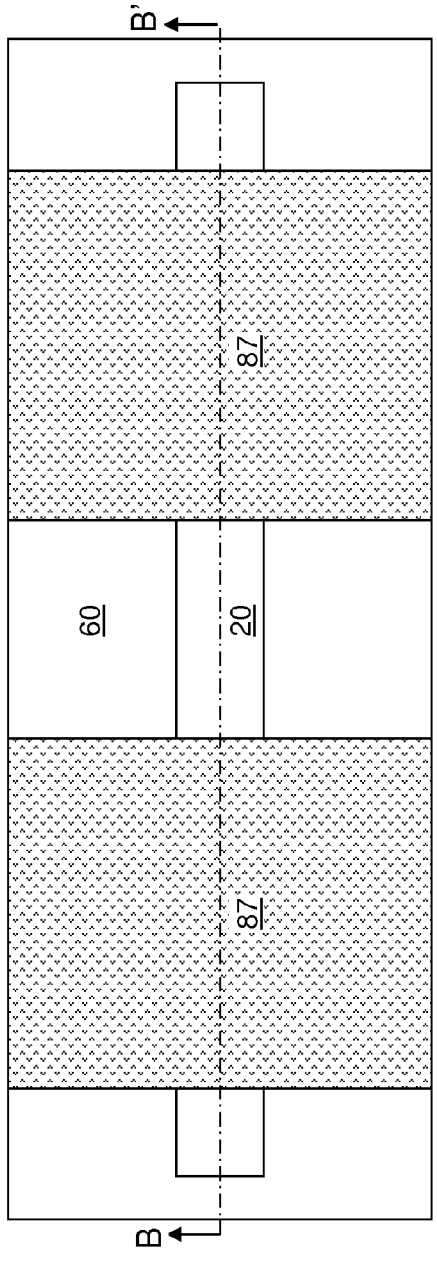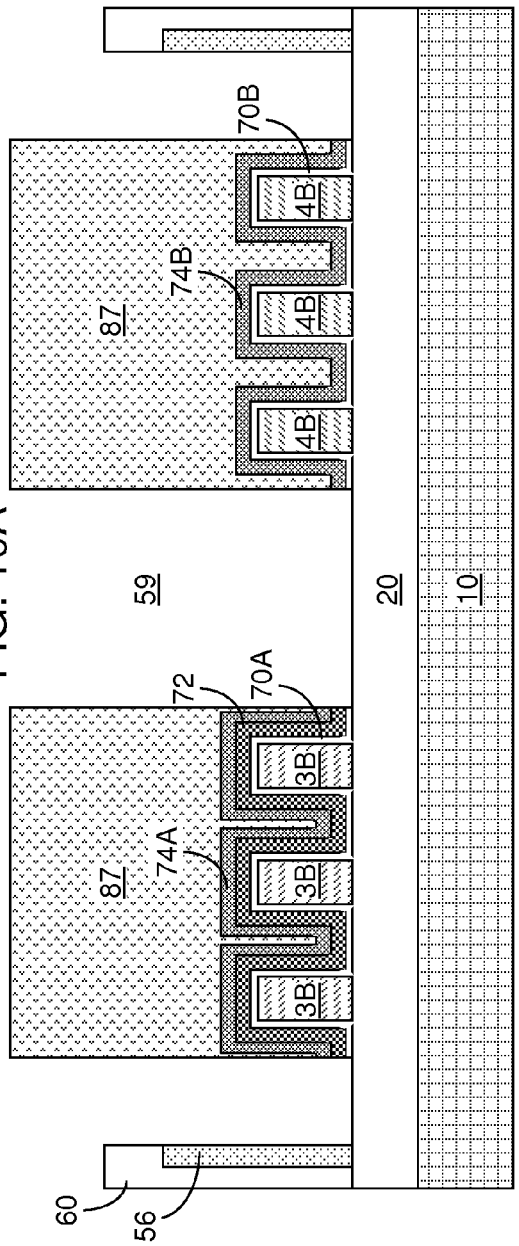
FIG. 10A
FIG. 10B

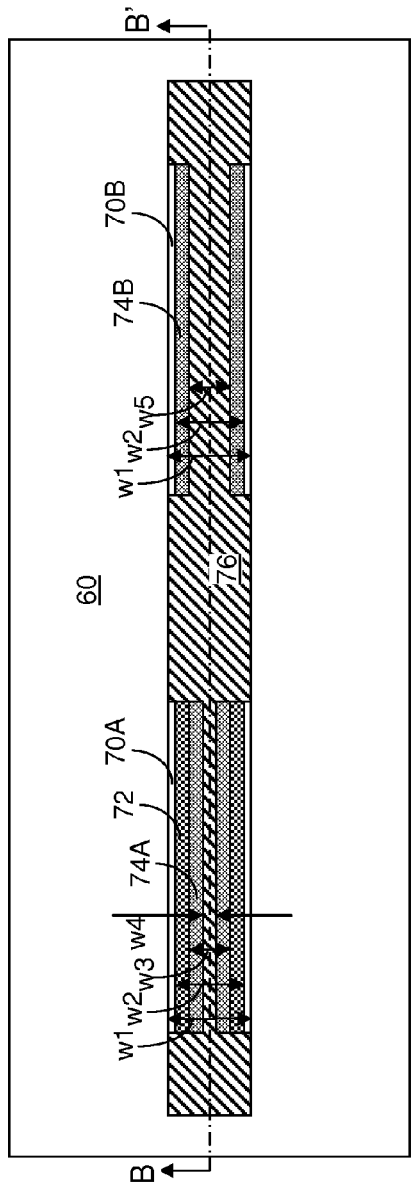
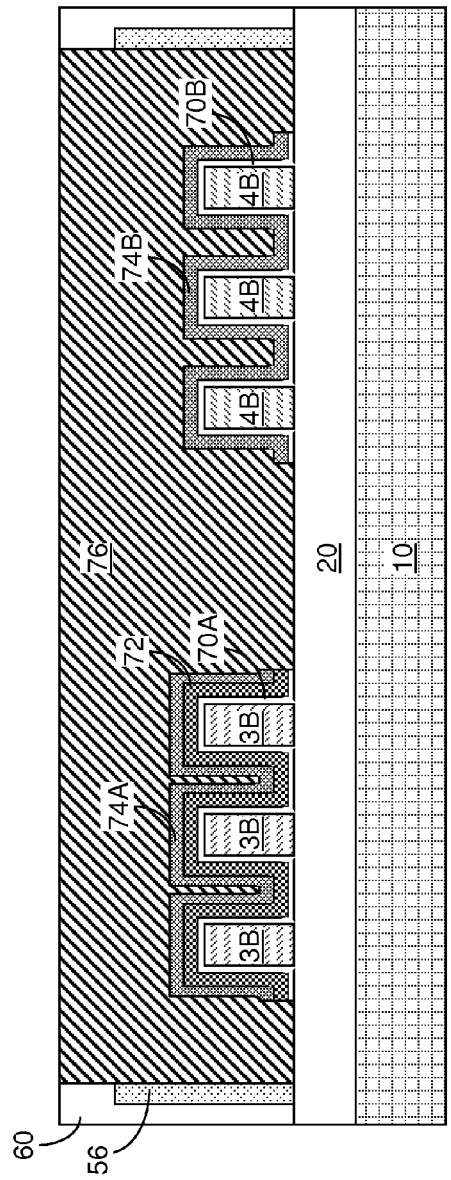
FIG. 11A
FIG. 11B

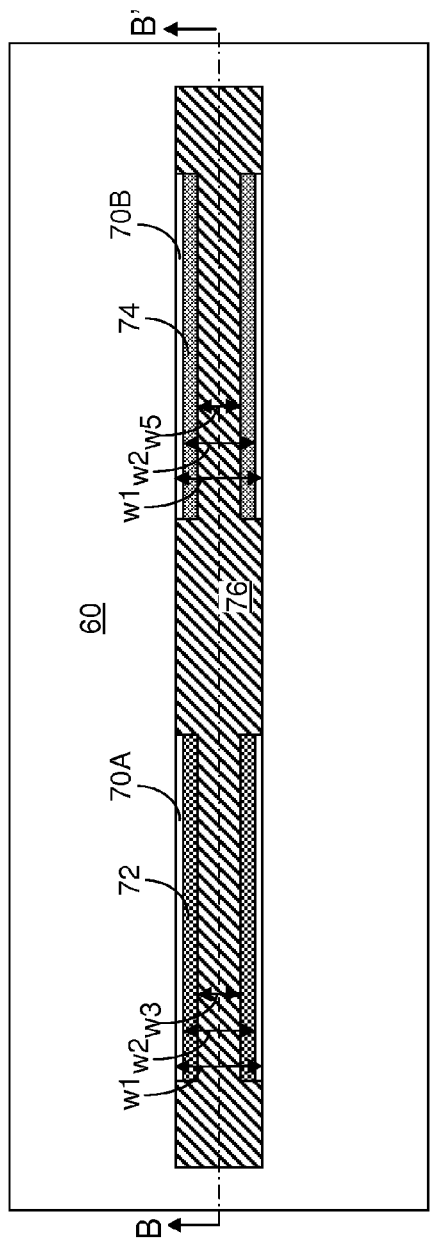
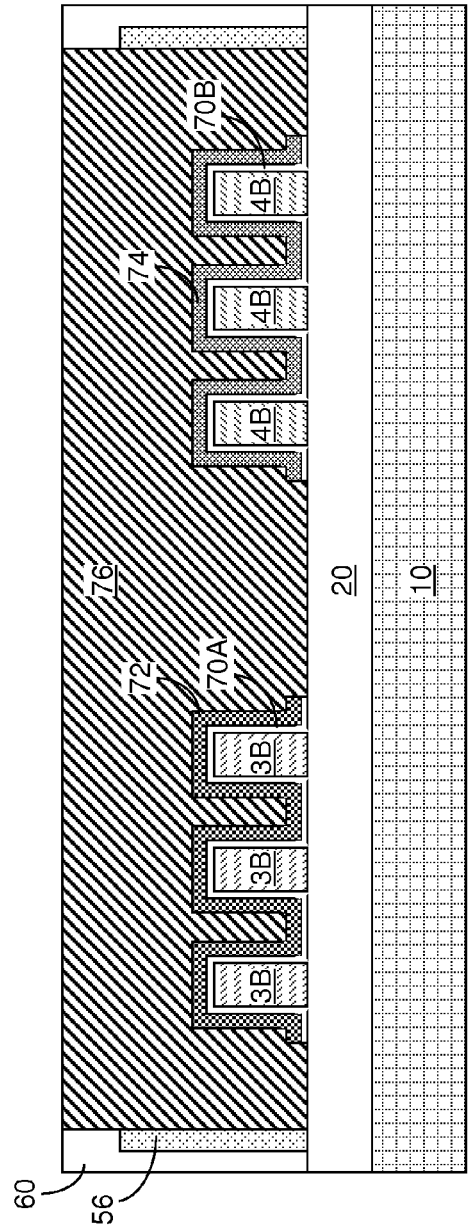
FIG. 14A
FIG. 14B

REPLACEMENT GATE STRUCTURE FOR ENHANCING CONDUCTIVITY

BACKGROUND

The present disclosure generally relates to semiconductor structures, and particularly to semiconductor structures having a replacement gate electrode configured to provide enhanced electrical conductivity, and methods of manufacturing the same.

In advanced semiconductor devices, the width of replacement gate electrodes scales with the overall size of a field effect transistor. Because scaling of a workfunction material layer within a replacement gate electrode is limited in order to provide optimal work function values to the replacement gate electrode, scaling of the replacement gate electrode can reduce the volume in which a high conductivity metal can be present. Such a reduction in the volume occupied by the high conductivity metal causes significant increase in the overall resistance of the replacement gate electrode. High resistance of the gate electrode structure adversely impacts the performance of field effect transistors by increase in signal delay and voltage loss. Thus, a method is desired for providing low resistance to a replacement gate electrode while providing optimal levels of work function to the region in proximity to channel regions of a field effect transistor.

SUMMARY

After formation of a gate cavity straddling at least one semiconductor material portion, a gate dielectric layer and at least one work function material layer is formed over the gate dielectric layer. The at least one work function material layer and the gate dielectric layer are patterned such that remaining portions of the at least one work function material layer are present only in proximity to the at least one semiconductor material portion. A conductive material having a greater conductivity than the at least one work function material layer is deposited in remaining portions of the gate cavity. The conductive material portion within a replacement gate structure has the full width of the replacement gate structure in regions from which the at least one work function material layer and the gate dielectric layer are removed.

According to an aspect of the present disclosure, a semiconductor structure is provided, which includes a field effect transistor located on a substrate, and a planarization dielectric layer embedding the field effect transistor. The field effect transistor includes a semiconductor material portion including a source region, a drain region, and a body region. The field effect transistor further includes a gate dielectric contacting, and straddling, the body region. In addition, the field effect transistor includes a work function material layer overlying the gate dielectric, and a conductive material portion overlying the work function material layer and contacting a sidewall of the gate dielectric and sidewalls of the planarization dielectric layer.

According to another aspect of the present disclosure, a method of forming a semiconductor structure is provided. A planarization dielectric layer is formed over a semiconductor material portion provided on a substrate. A gate cavity is formed within a planarization dielectric layer. The gate cavity straddles the semiconductor material portion. A stack of a gate dielectric layer and a work function material layer is formed in the gate cavity. The stack of the gate dielectric layer and the work function material layer is patterned such that portions of sidewalls of the planarization dielectric layer are physically exposed after patterning the stack. A conductive material portion is formed on a remaining portion of the work function material layer and directly on the physically exposed portions of sidewalls of the planarization dielectric layer.

BRIEF DESCRIPTION OF THE SEVERAL VIEWS OF THE DRAWINGS

FIG. 1A is a top-down view of a first exemplary semiconductor structure after formation of semiconductor material portions according to a first embodiment of the present disclosure.

FIG. 1B is a vertical cross-sectional view of the first exemplary semiconductor structure along the vertical plane B-B' of FIG. 1A.

FIG. 2A is a top-down view of the first exemplary semiconductor structure after formation of a disposable gate structure, a gate spacer, source regions, and drain regions according to the first embodiment of the present disclosure.

FIG. 2B is a vertical cross-sectional view of the first exemplary semiconductor structure along the vertical plane B-B' of FIG. 2A.

FIG. 3A is a top-down view of the first exemplary semiconductor structure after formation of raised source regions and raised drain regions according to the first embodiment of the present disclosure.

FIG. 3B is a vertical cross-sectional view of the first exemplary semiconductor structure along the vertical plane B-B' of FIG. 3A.

FIG. 5A is a top-down view of the first exemplary semiconductor structure after formation of a gate cavity by removal of the disposable gate structure according to the first embodiment of the present disclosure.

FIG. 5B is a vertical cross-sectional view of the first exemplary semiconductor structure along the vertical plane B-B' of FIG. 5A.

FIG. 8A is a top-down view of the first exemplary semiconductor structure after patterning of the first work function material layer according to the first embodiment of the present disclosure.

FIG. 8B is a vertical cross-sectional view of the first exemplary semiconductor structure along the vertical plane B-B' of FIG. 8A.

FIG. 9A is a top-down view of the first exemplary semiconductor structure after formation of a second work function material layer according to the first embodiment of the present disclosure.

FIG. 9B is a vertical cross-sectional view of the first exemplary semiconductor structure along the vertical plane B-B' of FIG. 9A.

FIG. 10A is a top-down view of the first exemplary semiconductor structure after patterning the second work function material layer according to the first embodiment of the present disclosure.

FIG. 10B is a vertical cross-sectional view of the first exemplary semiconductor structure along the vertical plane B-B' of FIG. 10A.

FIG. 11A is a top-down view of the first exemplary semiconductor structure after formation of a conductive material portion according to the first embodiment of the present disclosure.

FIG. 11B is a vertical cross-sectional view of the first exemplary semiconductor structure along the vertical plane B-B' of FIG. 11A.

FIG. 14A is a top-down view of the second exemplary semiconductor structure after formation of a conductive material portion according to the second embodiment of the present disclosure.

FIG. 14B is a vertical cross-sectional view of the second exemplary semiconductor structure along the vertical plane B-B' of FIG. 14A.

DETAILED DESCRIPTION

Figure 4A:
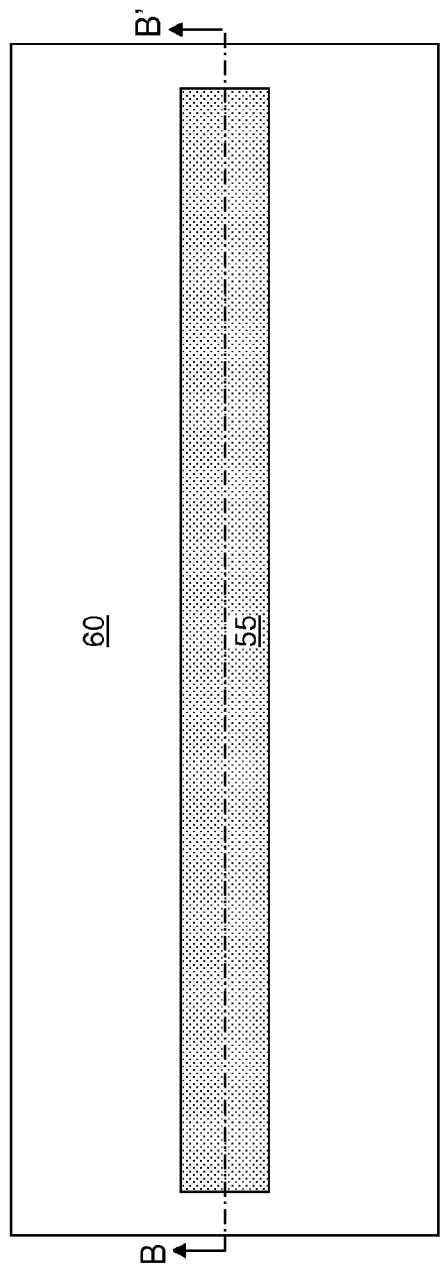
FIG. 4A is a top-down view of the first exemplary semiconductor structure after formation and planarization of a planarization dielectric layer according to the first embodiment of the present disclosure.

As stated above, the present disclosure relates to semiconductor structures having a replace gate electrode configured to provide enhanced electrical conductivity, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale. As used herein, ordinals such as "first," "second," and "third" are employed merely to distinguish similar elements, and different ordinals may be employed to designate a same element in the specification and/or claims.

As used herein, a field effect transistor refers to any planar transistor having a gate electrode overlying a horizontal planar channel, any fin field effect transistor having a gate electrode located on sidewalls of a semiconductor fin, or any other types of metal-oxide semiconductor field effect transistor (MOSFETs) and junction field effect transistors (JFETs).

Referring to FIGS. 1A and 1B, a first exemplary semiconductor structure according to a first embodiment of the present disclosure includes a substrate (10, 20), on which various semiconductor material portions (30, 40) are formed. The substrate (10, 20) can be a bulk substrate including a bulk semiconductor material throughout, or a stack of a buried insulator layer 20 and a handle substrate 10 derived from a semiconductor-on-insulator (SOI) substrate. The semiconductor material portions (30, 40) can be patterned from a topmost portion of a bulk semiconductor substrate, or can be patterned from a top semiconductor layer within an SOI substrate.

The various semiconductor material portions (30, 40) can include first semiconductor material portions 30 and second semiconductor material portions 40 that are laterally spaced from the first semiconductor material portions 30. In one embodiment, the first semiconductor material portions 30 and the second semiconductor material portions 40 can be semiconductor fins. As used herein, a semiconductor fin refers to a semiconductor material portion having a parallel pair of vertical sidewalls. The parallel pair of vertical sidewalls can laterally extend along the lengthwise direction of the semiconductor fin. As used herein, a lengthwise direction of an element is a direction along which the moment of inertia for the element is minimized for a rotational axis passing through the center of mass of the element in a hypothetical configuration in which the element is allowed to rotate freely. In this case, the semiconductor material portions (30 40) can be semiconductor fins and the substrate (10, 20) can include an insulator layer (i.e., the buried insulator layer 20) in contact with the semiconductor fins.

In another element, the first semiconductor material portions 30 and the second semiconductor material portions 40 can be planar semiconductor material portions laterally surrounded by a shallow trench isolation structure (not shown). In this case, the top surfaces of the first and second semiconductor material portions (30, 40) can be substantially coplanar with top surfaces of the shallow trench isolation structure.

The first and second semiconductor material portions (30, 40) can include any semiconductor material known in the art. The first semiconductor material portions 30 can include a first semiconductor material, and the second semiconductor material portions 40 can include a second semiconductor material. The first and second semiconductor materials can be the same, or can be different. Each of the first and second semiconductor materials can be intrinsic, or can be suitably doped with p-type dopants or n-type dopants.

Referring to FIGS. 2A and 2B, at least one disposable material layer can be deposited and patterned employing a combination of lithographic methods and at least one anisotropic etch to form a disposable gate structure (51, 53, 55). In one embodiment, the at least one disposable material layer can include, from bottom to top, a disposable dielectric layer, a disposable gate material layer, and a disposable cap layer. The disposable dielectric layer includes a dielectric material that can be removed selective to the semiconductor material portions (30, 40). For example, the disposable dielectric layer can include silicon oxide, silicon nitride, a dielectric metal oxide, or a combination thereof. The thickness of the disposable dielectric layer can be in a range from 1 nm to 10 nm, although lesser and greater thicknesses can also be employed. The disposable gate material layer can include a material that can be subsequently removed selective to the dielectric material of the disposable dielectric layer. For example, the disposable gate material layer can include a semiconductor material, amorphous carbon, an organic material, or a metallic material. The thickness of the disposable gate material layer depends on the target height of a replacement gate structure to be subsequently formed, and can be in a range from 100 nm to 500 nm, although lesser and greater heights can also be employed. The disposable cap layer can include a dielectric material such as silicon nitride. The thickness of the disposable cap layer depends on the height of the semiconductor material portions (30, 40) if the semiconductor material portions (30, 40) are semiconductor fins, and may otherwise depend on the anticipated erosion during subsequent planarization of a planarization dielectric layer.

The vertical stack of the disposable dielectric layer, the disposable gate material layer, and the disposable cap layer can be patterned, for example, by application of a photoresist layer on the top surface of the disposable cap layer, lithographic patterning of the photoresist layer, and an anisotropic etch that etches the materials of the vertical stack in areas that are not covered by the photoresist layer. The photoresist layer can be subsequently removed, for example, by ashing. The disposable gate structure (51, 53, 55) can include, from bottom to top, a disposable dielectric portion 51, a disposable gate material portion 53, and a disposable gate cap 55. The disposable dielectric portion 51 is a remaining portion of the disposable dielectric layer, the disposable gate material portion is a remaining portion of the disposable gate material layer, and the disposable gate cap is a remaining portion of the disposable gate cap layer. The disposable gate structure (51, 53, 55) straddles the semiconductor material portions (30, 40).

A gate spacer 56 including a dielectric material can be optionally formed, for example, by conformal deposition of at least one dielectric material and an anisotropic etch. The at least one dielectric material can include silicon oxide, silicon nitride, or a combination thereof. While the present disclosure is described employing an embodiment in which the gate spacer 56 is formed prior to formation of source regions and drain region, embodiments are expressly contemplated herein in which at least a portion of source regions and drain regions is formed prior to formation of the gate spacer 56.

Source regions (3S, 4S) and drain regions (3D, 4D) can be formed in the first and second semiconductor material portions (30, 40; See FIGS. 2A and 2B) employing methods known in the art. A first source region 3S and a first drain region 3D can be formed in the first semiconductor material portion (3S, 3D, 3B) by introduction of electrical dopants of a first conductivity type, which can be p-type or n-type. Each portion of the first semiconductor material portions 30 into which the electrical dopants of the first conductivity type are not introduced constitutes a first body region 3B. In one embodiment, p-n junctions can be formed between the first body region 3B and the first source and drain regions (3S, 3D). A second source region 4S and a second drain region 4D can be formed in each second semiconductor material portion (4S, 4D, 4B) by introduction of electrical dopants of a second conductivity type. The second conductivity type can be the same as, or can be different from, the first conductivity type. Each portion of the second semiconductor material portions (4S, 4D, 4B) into which the electrical dopants of the second conductivity type are not introduced constitutes a second body region 4B. In one embodiment, p-n junctions can be formed between the second body region 4B and the second source and drain regions (4S, 4D). Alternatively, the first body region 3B and/or the second body region 4B may be intrinsic.

Referring to FIGS. 3A and 3B, raised source regions (5S, 6S) and raised drain regions (5D, 6D) can be optionally formed by selective deposition of doped semiconductor materials. At least one disposable dielectric masking layer (not shown) may be employed to induce deposition of the deposited semiconductor material only in desired regions. Specifically, a first raised source region 5S and a first raised drain region 5D can be formed on the first source regions 3S and the first drain regions 3D, respectively. The first raised source region 5S and the first raised drain region 5D can have a doping of the first conductivity type. A second raised source region 6S and a second raised drain region 6D can be formed on the second source regions 4S and the second drain regions 4D, respectively. The second raised source region 6S and the second raised drain region 6D can have a doping of the second conductivity type. Optionally, metal semiconductor alloy regions (not shown) can be formed on the physically exposed surfaces of the raised source and drain regions (5S, 5D, 6S, 6D), or, if raised source and drain regions are not formed, on the physically exposed surfaces of the source and drain regions (3S, 3D, 4S, 4D).

Figure 4B:
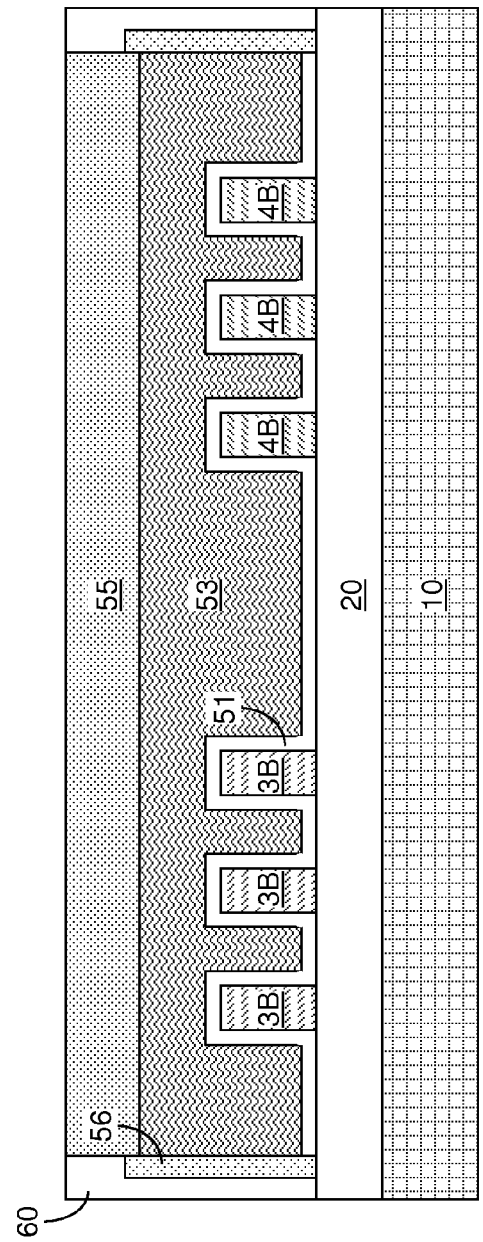
FIG. 4B is a vertical cross-sectional view of the first exemplary semiconductor structure along the vertical plane B-B' of FIG. 4A.

Referring to FIGS. 4A and 4B, a planarization dielectric layer 60 is deposited over the disposable gate structure (51, 53, 55) and the semiconductor material portions (3S, 3D, 3B, 4S, 4D, 4B), and can be subsequently planarized employing the disposable cap portions 55 as a stopping layer. The planarization dielectric layer 60 includes a dielectric material that may be easily planarized. For example, the planarization dielectric layer 60 can be composed of a doped silicate glass or an undoped silicate glass (silicon oxide). The planarization can be performed, for example, by chemical mechanical planarization (CMP). The planarization dielectric layer 60 laterally surrounds the semiconductor material portions (3S, 3D, 3B, 4S, 4D, 4B) and the disposable gate structure (51, 53, 55).

Referring to FIGS. 5A and 5B, the disposable gate structure (51, 53, 55) is removed by at least one etch. The at least one etch can be a recess etch, which can be an isotropic etch or anisotropic etch. The etch processes employed to remove the disposable gate cap 55 and the disposable gate material portion 53 can be selective to the dielectric materials of the planarization dielectric layer 60. The etch chemistry employed to remove the disposable dielectric portion 51 is selective to the semiconductor materials of the semiconductor material portions (3S, 3D, 3B, 4S, 4D, 4B). Thus, the disposable gate structure (51, 53, 55) can be removed selective to the planarization dielectric layer 60 and to the semiconductor material portions (3S, 3D, 3B, 4S, 4D, 4B). A gate cavity 59 is formed in a volume from which the disposable gate structure (51, 53, 55) is removed. The gate cavity 59 can be laterally enclosed by the gate spacer 56 and the planarization dielectric layer 60.

Figure 6A:
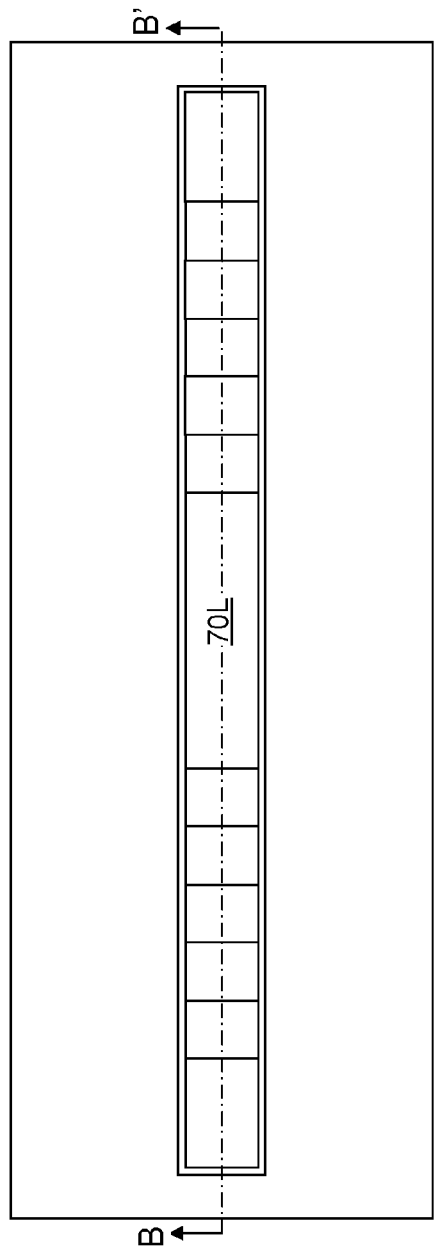
FIG. 6A is a top-down view of the first exemplary semiconductor structure after formation of a gate dielectric layer according to the first embodiment of the present disclosure.
Figure 6B:
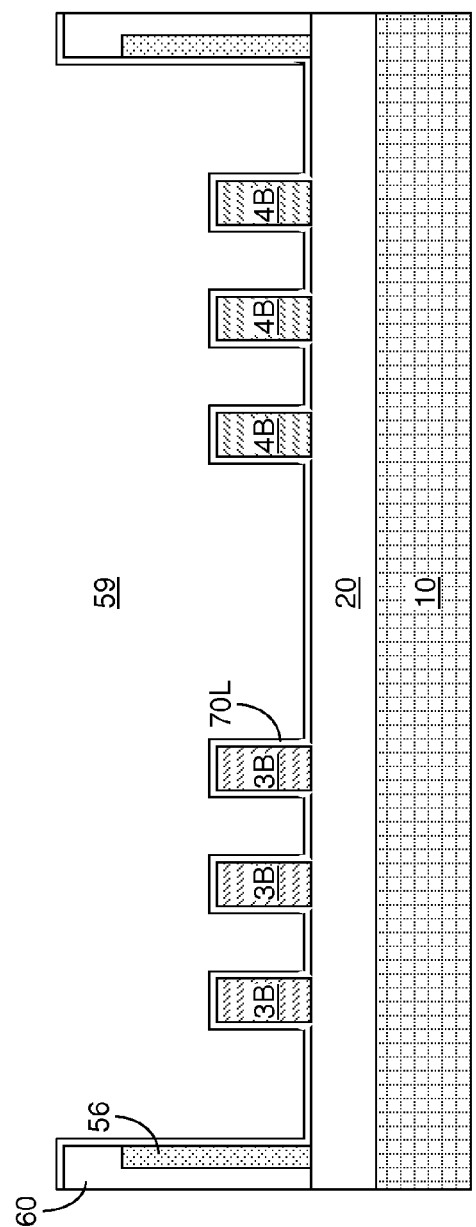
FIG. 6B is a vertical cross-sectional view of the first exemplary semiconductor structure along the vertical plane B-B' of FIG. 6A.

Referring to FIGS. 6A and 6B, a gate dielectric layer 70L can be formed on the physically exposed surfaces of the gate cavity 59, which include surfaces of the semiconductor material portions (3S, 3D, 3B, 4S, 4D, 4B). The gate dielectric layer 70L can include an oxide or an oxynitride of a semiconductor material such as silicon oxide, silicon oxynitride, an oxide of a silicon-germanium alloy, or an oxynitride of a silicon-germanium alloy. Additionally or alternatively, the gate dielectric layer 70L can include a material commonly known as a "high dielectric constant material." A "high dielectric constant material," or a "high-k dielectric material," herein refers to a dielectric material having a dielectric constant greater than 8.0. In one embodiment, the gate dielectric layer 70L can include a dielectric metal oxide, which is a high-k dielectric material containing a compound of at least one elemental metal and at least one oxygen atom. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 70L, as measured at sidewalls of the semiconductor material portions (3S, 3D, 3B, 4S, 4D, 4B), can be in a range from 0.9 nm to 10 nm, although lesser and greater thicknesses can also be employed. The gate dielectric layer 70L can be formed, for example, by thermal oxidation, thermal nitridation, plasma oxidation, plasma nitridation, chemical vapor deposition (CVD), atomic layer deposition (ALD), liquid phase deposition (LPD), or other deposition methods known in the art.

Figure 7A:
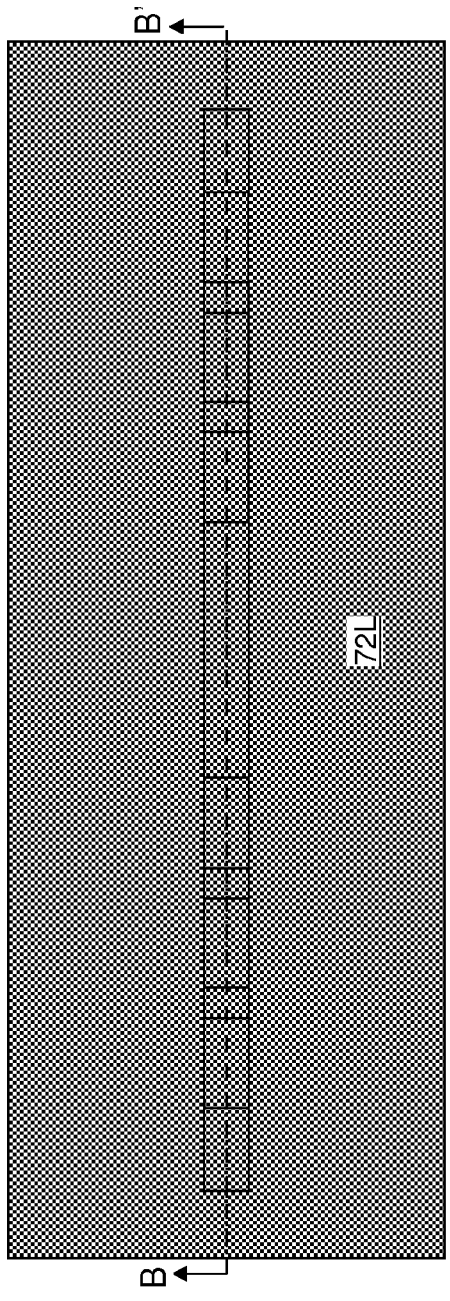
FIG. 7A is a top-down view of the first exemplary semiconductor structure after formation of a first work function material layer according to the first embodiment of the present disclosure.
Figure 7B:
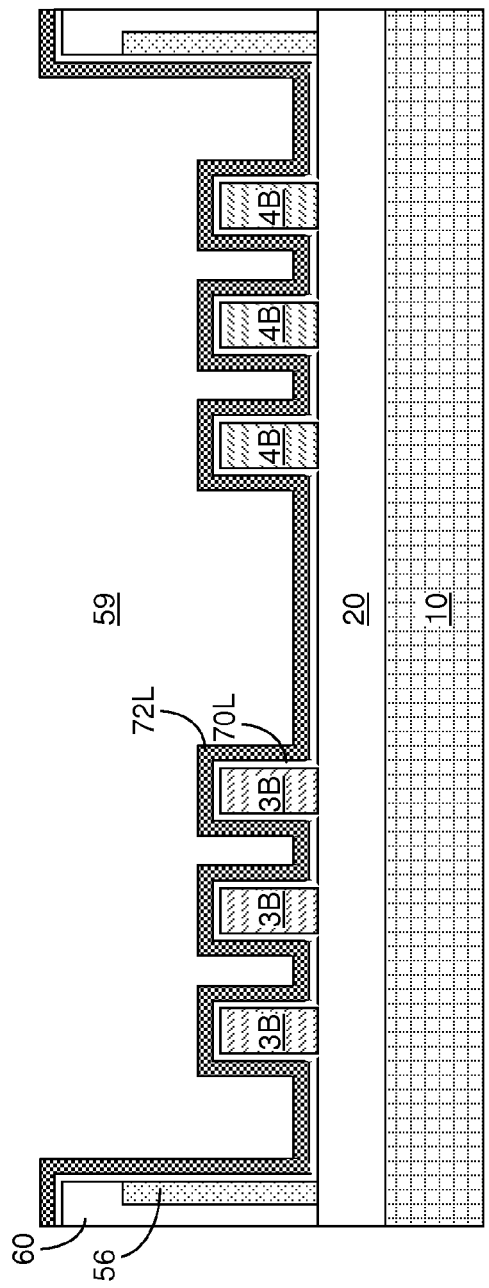
FIG. 7B is a vertical cross-sectional view of the first exemplary semiconductor structure along the vertical plane B-B' of FIG. 7A.

Referring to FIGS. 7A and 7B, a first work function material layer 72L can be deposited directly on the gate dielectric layer 70L. The first work function material layer 72L includes a conductive material that controls the threshold voltage of field effect transistors including the first semiconductor material portions (3S, 3D, 3B). The first work function material layer 72L can include a metallic material or a doped semiconductor material.

In one embodiment, the first body regions 3B can be doped with p-type electrical dopants and the second body regions 4B can be doped with n-type electrical dopants. In this case, the first work function material layer 72L can include a silicon valence band edge metals such as Pt, Rh, Ir, Ru, Cu, Os, Be, Co, Pd, Te, Cr, Ni, TiN, and/or alloys thereof. In an illustrative example, the first work function material layer 72L can be a layer of TiN.

In another embodiment, the first body regions 3B can be doped with n-type electrical dopants and the second body regions 4B can be doped with p-type electrical dopants. In this case, the first work function material layer 72L can include a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and/or alloys thereof. In an illustrative example, the first work function material layer 72L can be a layer of TiAl.

In general, any conductive material suitable for setting the work function of a gate electrode of a field effect transistor as known in the art can be selected for the material of the first work function material layer 72L. The first work function material layer 72L can be formed, for example, by physical vapor deposition, chemical vapor deposition, or atomic layer deposition (ALD). The first work function material layer 72L can be conformally, or non-conformally, deposited. The thickness of the first work function material layer 72L, as measured on the vertical portions of the gate dielectric layer 70L that contact the sidewalls of the semiconductor material portions (3S, 3D, 3B, 4S, 4D, 4B) can be in a range from 2 nm to 30 nm, although lesser and greater thicknesses can also be employed.

Referring to FIGS. 8A and 8B, the first work function material layer 72L can be patterned to remove portions of the first work function material layer 72L from outside of an area including the first semiconductor material portions (3S, 3D, 3B). In one embodiment, a first photoresist layer 77 can be applied over the first work function material layer 72L, and can be lithographically patterned to cover a contiguous area overlying the first semiconductor material portions (3S, 3D, 3B), while the first photoresist layer 77 is removed from areas that do not include the first semiconductor material portions (3S, 3D, 3B). Particularly, the first photoresist layer 77 can be removed from above the second semiconductor material portions (4S, 4D, 4B) and from the area between the first semiconductor material portions (3S, 3D, 3B) and the second semiconductor material portions (4S, 4D, 4B). A remaining portion of the first work function material layer 72L overlies the first semiconductor material portions (3S, 3D, 3B), and does not overlie the second semiconductor material portions (4S, 4D, 4B).

Physically exposed portions of the first work function material layer 72L can be removed by an isotropic etch that employs the patterned first photoresist layer 77 as an etch mask. For example, the isotropic etch can be a wet etch for removing the material of the first work function material layer 72L. The isotropic etch can be selective to the dielectric material of the gate dielectric layer 70L so that the gate dielectric layer 70L may remain intact after the isotropic etch. The remaining portion of the first work function material layer 72L is herein referred to as a first work function material layer 72. Sidewalls of the first work function material layer 72 are physically exposed. The first photoresist layer 77 can be subsequently removed, for example, by ashing.

Referring to FIGS. 9A and 9B, a second work function material layer 74L can be deposited directly on the physically exposed portions of the gate dielectric layer 70L and on the surfaces of the remaining portion of the first work function material layer 72L, i.e., the first work function material layer 72. The second work function material layer 74L includes a conductive material that controls the threshold voltage of field effect transistors including the second semiconductor material portions (4S, 4D, 4B). The second work function material layer 74L can include a metallic material or a doped semiconductor material.

In one embodiment, the first body regions 3B can be doped with p-type electrical dopants and the second body regions 4B can be doped with n-type electrical dopants. In this case, the first work function material layer 72L can include a silicon valence band edge metals such as Pt, Rh, Ir, Ru, Cu, Os, Be, Co, Pd, Te, Cr, Ni, TiN, and/or alloys thereof, and the second work function material layer 74L can include a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and/or alloys thereof. In an illustrative example, the first work function material layer 72L can be a layer of TiN, and the second work function material layer 74L can be a layer of TiAl.

In another embodiment, the first body regions 3B can be doped with n-type electrical dopants and the second body regions 4B can be doped with p-type electrical dopants. In this case, the first work function material layer 72L can include a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and/or alloys thereof, and the second work function material layer 74L can include a silicon valence band edge metals such as Pt, Rh, Ir, Ru, Cu, Os, Be, Co, Pd, Te, Cr, Ni, TiN, and/or alloys thereof. In an illustrative example, the first work function material layer 72L can be a layer of TiAl, and the second work function material layer 74L can be a layer of TiN.

In general, any conductive material suitable for setting the work function of a gate electrode of a field effect transistor as known in the art can be selected for the material of the second work function material layer 74L. The second work function material layer 74L can be formed, for example, by physical vapor deposition, chemical vapor deposition, or atomic layer deposition (ALD). The second work function material layer 74L can be conformally, or non-conformally, deposited. The thickness of the second work function material layer 74L, as measured on the vertical portions of the gate dielectric layer 70L that contact the sidewalls of the second semiconductor material portions (4S, 4D, 4B) can be in a range from 2 nm to 30 nm, although lesser and greater thicknesses can also be employed.

Referring to FIGS. 10A and 10B, the second work function material layer 74L can be patterned to remove portions of the second work function material layer 74L from outside of areas including the semiconductor material portions (3S, 3D, 3B). In one embodiment, a second photoresist layer 87 can be applied over the second work function material layer 74L, and can be lithographically patterned to cover a contiguous area overlying the first semiconductor material portions (3S, 3D, 3B) and another contiguous area overlying the second semiconductor material portions (4S, 4D, 4B), while the second photoresist layer 87 is removed from areas that do not include the first or second semiconductor material portions (3S, 3D, 3B, 4S, 4D, 4B). Particularly, the second photoresist layer 87 can be removed from the area between the first semiconductor material portions (3S, 3D, 3B) and the second semiconductor material portions (4S, 4D, 4B). A first remaining portion of the second work function material layer 74L overlies the first semiconductor material portions (3S, 3D, 3B), and is herein referred to as a first-device second work function material layer 74A, i.e., a second workfunction material portion employed for a first device. A second remaining portion of the second work function material layer 74L overlies the second semiconductor material portions (4S, 4D, 4B), and is herein referred to as a second-device second work function material layer 74B, i.e., a second work function material layer employed for a second device.

Physically exposed portions of the second work function material layer 74L can be removed by an isotropic etch that employs the patterned second photoresist layer 87 as an etch mask. For example, the isotropic etch can be a wet etch for removing the material of the second work function material layer 74L. In one embodiment, any physically exposed portions of the first work function material layer 72L that is not masked by the second photoresist layer 87 can also be removed by the isotropic etch. In this case, the sidewalls of the remaining portions of the work function material layers (72L, 74L) can be vertically coincident with sidewalls of the second photoresist layer 87.

The isotropic etch may be selective to the dielectric material of the gate dielectric layer 70L so that the gate dielectric layer 70L may remain intact after the isotropic etch. In this case, another isotropic etch or an anisotropic etch can be employed to remove the physically exposed portions of the gate dielectric layer 70L. Alternately, the isotropic etch may not be selective to the dielectric material of the gate dielectric layer 70L, and the physically exposed portions of the gate dielectric layer 70L can be etched after removal of the physically exposed portions of the second work function material layer 74L. The second photoresist layer 87 can be subsequently removed, for example, by ashing.

The remaining portion of the gate dielectric layer 70L overlying the first semiconductor material portions (3S, 3D, 3B) constitutes a first gate dielectric 70A, and the remaining portion of the gate dielectric layer 70L overlying the second semiconductor material portions (4S, 4D, 4B) constitutes a second gate dielectric 70B. In one embodiment, the first-device second work function material layer 74A (which is a patterned portion of the second work function material layer 74L), the first work function material layer 72 (which is a patterned portion of the first work function material layer 72L), and the first gate dielectric 70A (which is a patterned portion of the gate dielectric layer 70L) can include sidewalls that are vertically coincident among one another. In another embodiment, the second-device second work function material layer 74B (which is a patterned portion of the second work function material layer 74L) and the second gate dielectric 70B (which is a patterned portion of the gate dielectric layer 70L) can include sidewalls that are vertically coincident among one another.

The combination of the processing steps of FIGS. 8A, 8B, 10A, and 10B collectively patterns the stack of the gate dielectric layer 70L and the first and second work function material layers (72L, 74L). Portions of sidewalls of the planarization dielectric layer 60 and inner sidewalls of the gate spacer 56 are physically exposed after patterning the stack of the gate dielectric layer 70L and the first and second work function material layers (72L, 74L). Further, a portion of a top surface of the substrate (10, 20) is physically exposed after patterning of the gate dielectric layer 70L and the first and second work function material layers (72L, 74L).

Referring to FIGS. 11A and 11B, a conductive material having a greater electrical conductivity than the first and second work function material layers (72, 74A, 74B) is deposited to fill the gate cavity 59. The conductive material can be, for example, W, Al, Cu, Ag, Au, alloys thereof, or combinations thereof. The conductive material can be deposited, for example, by physical vapor deposition (PVD), chemical vapor deposition (CVD), electroplating, electroless plating, or combinations thereof. The portions of the deposited conductive material, the first and second work function material layers (72, 74A, 74B), and the gate dielectrics (70A, 70B) above a horizontal plane including the top surface of the planarization dielectric layer 60 can be removed by planarization, which can be performed, for example, by chemical mechanical planarization, a recess etch, or a combination thereof. The remaining portion of the conductive material that fills the gate cavity 59 constitutes a conductive material portion 76.

The conductive material portion 76 is formed on remaining portions of the first and second work function material layers (72, 74A, 74B) and directly on the physically exposed portions of sidewalls of the planarization dielectric layer 60. Specifically, the conductive material portion 76 is formed directly on the top surfaces and sidewall surfaces of the second work function material layers (74A, 74B) and sidewall surfaces of the first work function material layer 72. Further, the conductive material portion is formed directly on sidewall surfaces of the gate dielectrics (70A, 70B). In addition, the conductive material portion 76 is formed directly on a portion of the top surface of the substrate (10, 20), which is a portion of the top surface of the buried insulator layer 20.

The first exemplary semiconductor structure includes a first field effect transistor (3S, 3D, 3B, 5S, 5D, 70A, 72, 74A, 76) and a second field effect transistor (4S, 4D, 4B, 6S, 6D, 70B, 74B, 76) located on a substrate (10, 20), and a planarization dielectric layer 60 embedding the first and second field effect transistors. The first field effect transistor includes at least a first semiconductor material portion (3S, 3D, 3B) including a first source region 3S, a first drain region 3D, and a first body region 3B; a first gate dielectric 70A contacting, and straddling, the first body region 3B; a first work function material layer 72 overlying the gate dielectric; and a conductive material portion 76 overlying the first work function material layer 72 and contacting a sidewall of the first gate dielectric 70A and sidewalls of the planarization dielectric layer 60. The second field effect transistor includes at least a second semiconductor material portion (4S, 4D, 4B) including a second source region 4S, a second drain region 4D, and a second body region 4B; a second gate dielectric 70B contacting, and straddling, the second body region 4B; a second-device second work function material layer 74B overlying the second gate dielectric 70B; and a conductive material portion 76 overlying the second-device work function material layer 74B and contacting a sidewall of the second gate dielectric 70B and sidewalls of the planarization dielectric layer 60. The conductive material portion 76 is common to the first and second field effect transistors.

The conductive material portion 76 is in contact with a top surface of the substrate (10, 20). The topmost surfaces of the first and second gate dielectrics (70A, 70B), the work function material layers (72, 74A, 74B), and the conductive material portion 76 are located within the same horizontal plane that includes the top surface of the planarization dielectric layer 60. Outer sidewalls of the gate dielectrics (70A, 70B) contiguously extend from the horizontal plane to another horizontal plane including the top surface of the substrate (10, 20).

Two outer sidewalls of the first gate dielectric 70A can be laterally spaced from each other by a first width w1, which is the same lateral distance as the maximum width of the conductive material portion 76. Two outer sidewalls of the second gate dielectric 70B can be laterally spaced from each other by the first width w1. Thus, the maximum width of the conductive material portion 76 is the first width w1. As used herein, the width of an element is measured along a horizontal direction that is perpendicular to the lengthwise direction of the element. As used herein, a lengthwise direction of an element refers to a horizontal direction including a pair of sidewalls having the greatest lateral dimension.

Two inner sidewalls of the first gate dielectric 70A are laterally spaced from each other by a second width w2, which is less than the first width w1 by twice the thickness of the gate dielectrics (70A, 70B). Two inner sidewalls of the second gate dielectric 70B are laterally spaced from each other by the second width w2. Two outer sidewalls of the first work function material layer 72 are laterally spaced from each other by the second width w2. Two outer sidewalls of the second-device second work function material layer 74B are laterally spaced from each other by the second width w2.

Two inner sidewalls of the first work function material layer 72 are laterally spaced from each other by a third width w3, which is less than the second width w2 by twice the thickness of the first work function material layer 72. Two outer sidewalls of the first-device second work function material layer 74A are laterally spaced from each other by the third width w3.

Two inner sidewalls of the first-device second work function material layer 74A in contact with a parallel pair of sidewalls of the conductive material portion 76 are laterally spaced from each other by a fourth width w4, which is less than the third width w3 by twice the thickness of the second work function material layers (74A, 74B).

Two inner sidewalls of the second-device second work function material layer 74B in contact with another parallel pair of sidewalls of the conductive material portion 76 are laterally spaced from each other by a fifth width w5, which is less than the second width w2 by twice the thickness of the second work function material layers (74A, 74B).

The lateral distance between two vertical interfaces between the conductive material portion 76 and the planarization dielectric layer 60 is the first width w1, which is greater than the lateral distance between two vertical interfaces between the conductive material portion 70 and the first-device second work function material layer 74A (which is the fourth width w4), and is greater than the lateral distance between two vertical interfaces between the conductive material portion 76 and the second-device second work function material layer 74B (which is the fifth width w5).

An outer sidewall of the first gate dielectric 70A, an outer sidewall of the second gate dielectric 70B, and an outer sidewall of the conductive material portion 76 can be located within a same vertical plane. The first work function material layer 72 can be laterally spaced from the planarization dielectric layer 60 by the thickness of the gate dielectrics (70A, 70B). The second-device second work function material layer 74B can be laterally spaced from the planarization dielectric layer 60 by the thickness of the gate dielectrics (70A, 70B).

The conductive material portion 76 has a greater width, i.e., the first width w1, in regions in which the gate dielectrics (70A, 70B) or the work function material layers (72, 74A, 74B) are not present. By selecting a material having a greater electrical conductivity (i.e., a lesser electrical resistivity) for the material of the conductive material portion 76 than the materials of the work function material layers (72, 74A, 74B), and by removing the gate dielectrics (70A, 70B) in regions that do not overlie the semiconductor material portions (3S, 3D, 3B, 4S, 4D, 4B), the conductivity of the gate electrode (72, 74A, 74B, 76) can be lowered compared to structures in which the gate dielectrics (70A, 70B) or the work function material layers (72, 74A, 74B) are not removed in regions between two field effect transistors or outside the areas of the semiconductor material portions (3S, 3D, 3B, 4S, 4D, 4B).

Figure 12A:
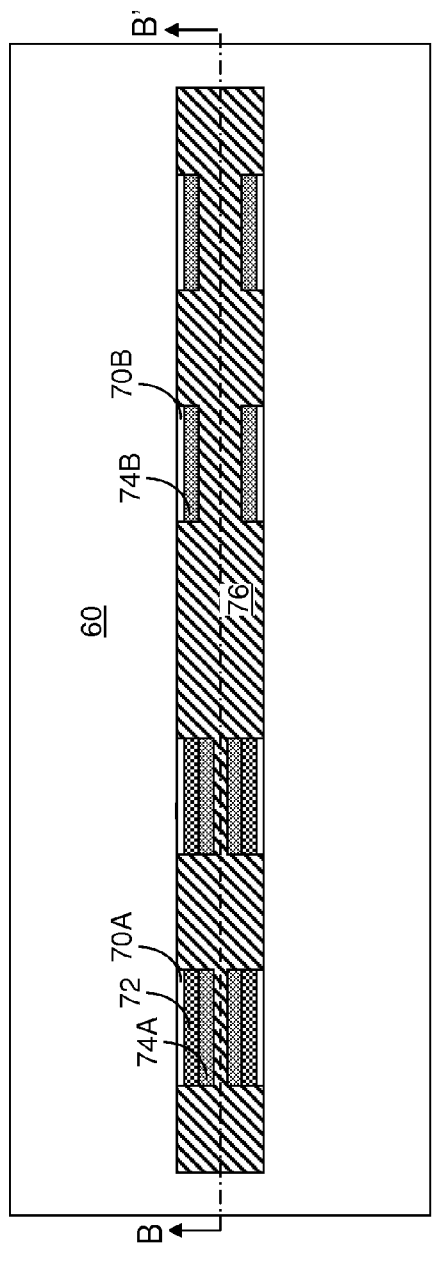
FIG. 12A is a top-down view of a variation of the first exemplary semiconductor structure according to the first embodiment of the present disclosure.
Figure 12B:
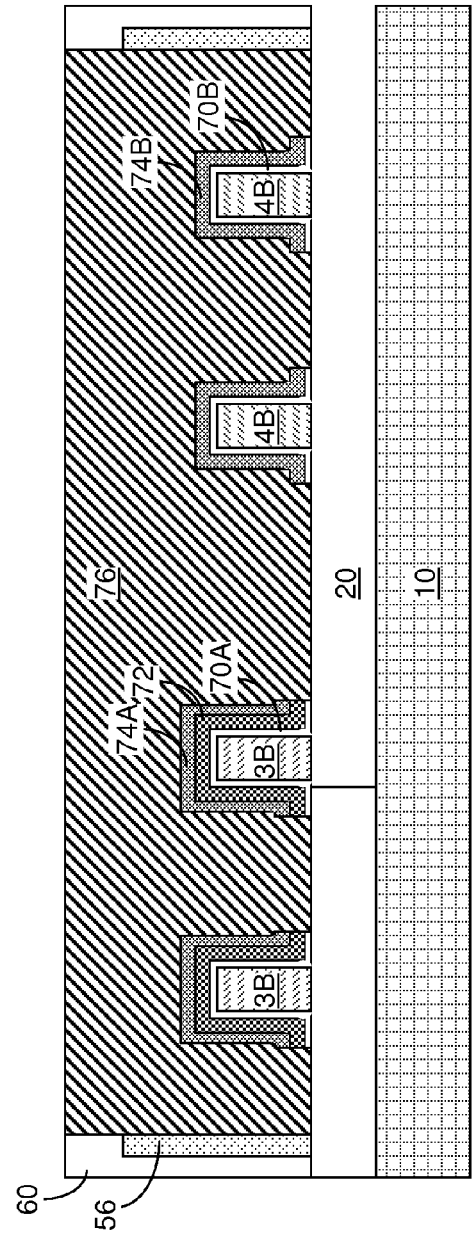
FIG. 12B is a vertical cross-sectional view of the variation of the first exemplary semiconductor structure along the vertical plane B-B' of FIG. 12A.

Referring to FIGS. 12A and 12B, a variation of the first exemplary semiconductor structure can be derived from the first exemplary semiconductor structure by increasing the spacing between the first semiconductor material portions (3S, 3D, 3B) and/or the spacing between the second semiconductor material portions (4S, 4D, 4B). In this case, the first gate dielectric 70A, the first work function material layer 72, and the first-device second work function material layer 74A can be removed in an area between each pair of first semiconductor material portions (3S, 3D, 3B). Likewise, the second gate dielectric 70B and the second-device second work function material layer 74B can be removed in an area between each pair of second semiconductor material portions (4S, 4D, 4B) during the patterning steps of FIGS. 8A, 8B, 10A, and 10B.

Figure 13A:
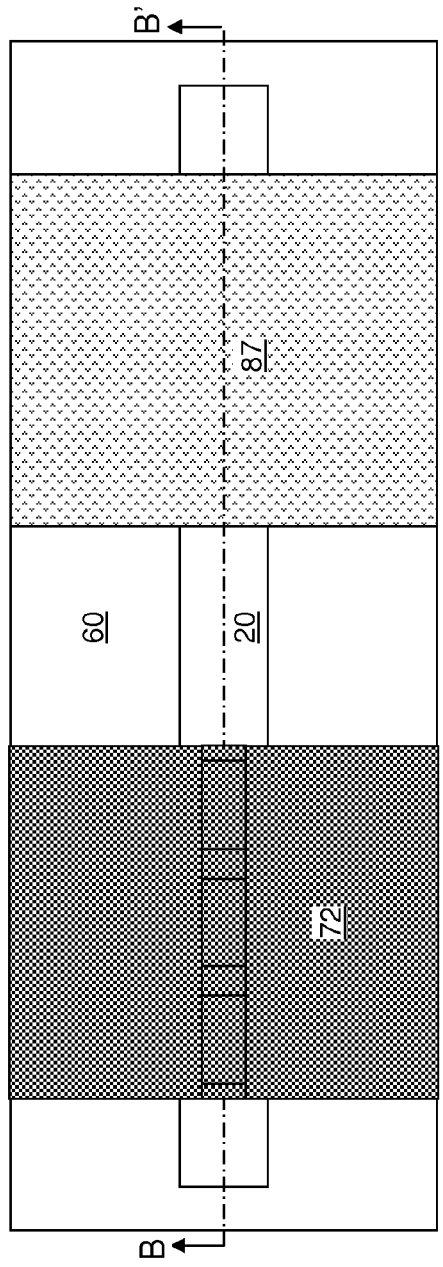
FIG. 13A is a top-down view of a second exemplary semiconductor structure after patterning the second wok function metallic layer according to the second embodiment of the present disclosure.
Figure 13B:
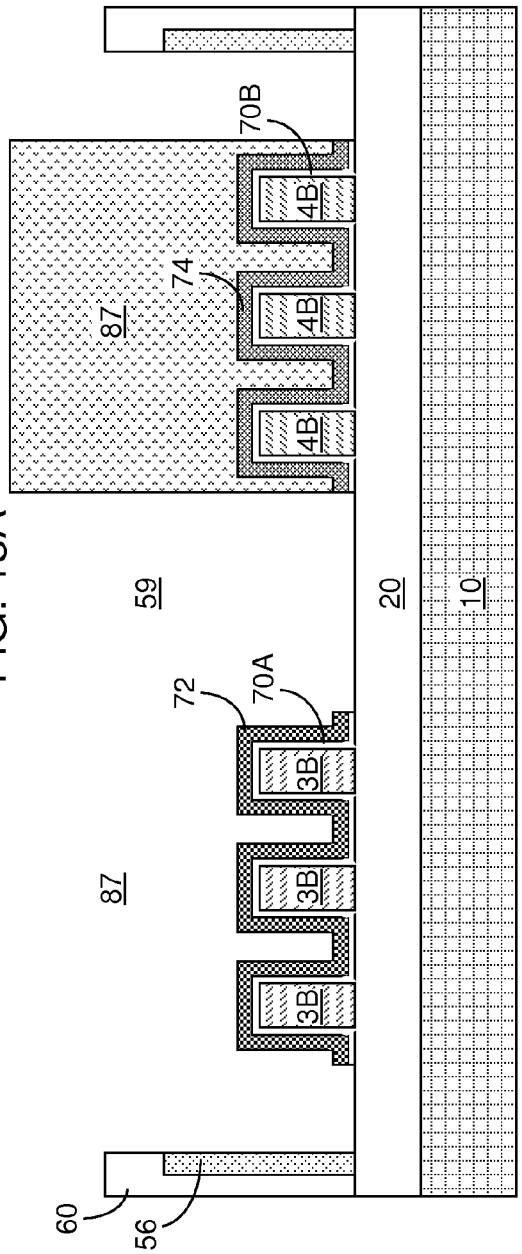
FIG. 13B is a vertical cross-sectional view of the second exemplary semiconductor structure along the vertical plane B-B' of FIG. 13A.

Referring to FIGS. 13A and 13B, a second exemplary semiconductor structure according to the second embodiment of the present disclosure can be derived from the first exemplary semiconductor structure of FIGS. 9A and 9B by performing the processing steps of FIGS. 10A and 10B with a modification in the pattern of the patterned second photoresist layer 87. Specifically, the second photoresist layer 87 is patterned to cover the second semiconductor material portions (4S, 4D, 4B), while the area of the first semiconductor material portions (3S, 3D, 3B) is not covered by the second photoresist layer 87. Thus, the second work function material layer 74L is removed from above the first work function material layer 72 in the second embodiment. As a consequence, a first-device second work function material layer 74A illustrated in FIGS. 10A, 10B, 11A, and 11B is not present in the second exemplary semiconductor structure.

Referring to FIGS. 14A and 14B, the processing steps of FIGS. 11A and 11B are performed to form the conductive material portion 76. The second exemplary semiconductor structure differs from the first exemplary semiconductor structure of FIGS. 11A and 11B by the absence of the first-device second work function material layer 74A. Correspondingly, two inner sidewalls of the first work function material layer 72 in contact with a parallel pair of sidewalls of the conductive material portion 76 are laterally spaced from each other by the third width w3, which is less than the second width w2 by twice the thickness of the first work function material layer 72.

Figure 15A:
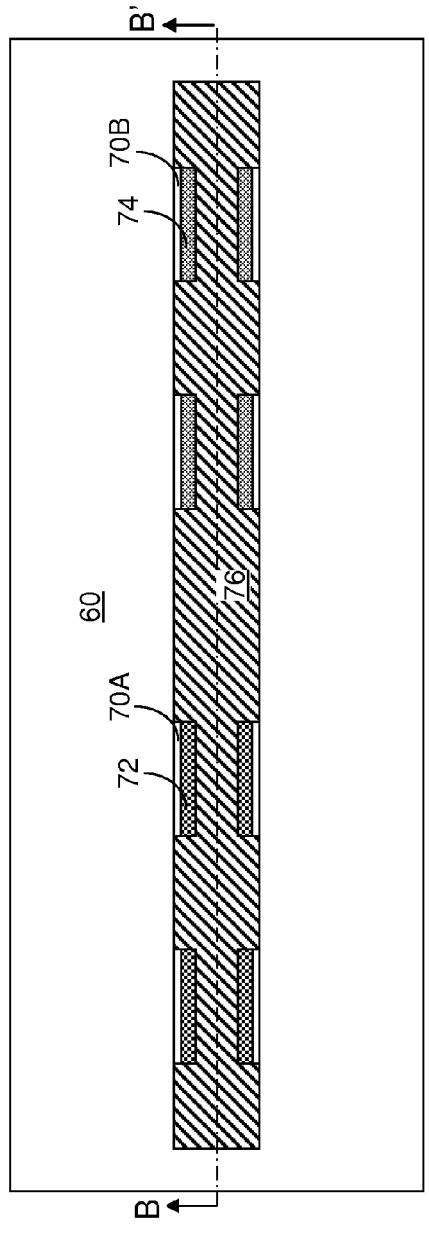
FIG. 15A is a top-down view of a variation of the second exemplary semiconductor structure according to the first embodiment of the present disclosure.
Figure 15B:
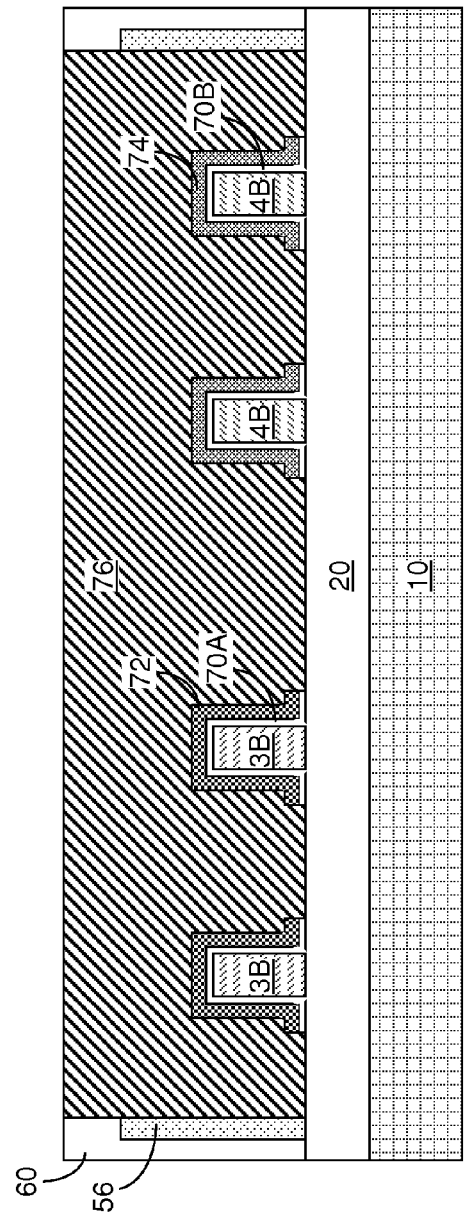
FIG. 15B is a vertical cross-sectional view of the variation of the second exemplary semiconductor structure along the vertical plane B-B' of FIG. 15A.

Referring to FIGS. 15A and 15B, a variation of the second exemplary semiconductor structure can be derived from the second exemplary semiconductor structure by increasing the spacing between the first semiconductor material portions (3S, 3D, 3B) and/or the spacing between the second semiconductor material portions (4S, 4D, 4B). In this case, the first gate dielectric 70A, the first work function material layer 72, and the first-device second work function material layer 74A can be removed in an area between each pair of first semiconductor material portions (3S, 3D, 3B). Likewise, the second gate dielectric 70B and the second-device second work function material layer 74B can be removed in an area between each pair of second semiconductor material portions (4S, 4D, 4B) during the patterning steps of FIGS. 8A, 8B, 13A, and 13B.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
   a field effect transistor located on a substrate; and
   a planarization dielectric layer embedding said field effect transistor, wherein said field effect transistor comprises:
   a semiconductor material portion including a source region, a drain region, and a body region;
   a gate dielectric contacting, and straddling, said body region;
   a work function material layer overlying said gate dielectric; and
   a conductive material portion overlying said work function material layer and contacting a sidewall of said gate dielectric and sidewalls of said planarization dielectric layer, and wherein said conductive material portion is in direct contact with a top surface of said substrate.

2. The semiconductor structure of claim 1, wherein topmost surfaces of said gate dielectric, said work function material layer, and said conductive material portion are located within a same horizontal plane.

3. The semiconductor structure of claim 2, wherein outer sidewalls of said gate dielectric contiguously extend from said horizontal plane to another horizontal plane including a top surface of said substrate.

4. The semiconductor structure of claim 2, wherein two outer sidewalls of said gate dielectric are laterally spaced from each other by a same lateral distance as a maximum width of said conductive material portion.

5. The semiconductor structure of claim 4, wherein two inner sidewalls of said gate dielectric are laterally spaced from each other by a greater distance than a lateral distance between another pair of outer sidewalls of said conductive material portion.

6. The semiconductor structure of claim 4, wherein a lateral distance between two vertical interfaces between said conductive material portion and said planarization dielectric layer is greater than a lateral distance between two vertical interfaces between said conductive material portion and said work function material layer.

7. The semiconductor structure of claim 2, wherein an outer sidewall of said gate dielectric and an outer sidewall of said conductive material portion are located within a same vertical plane.

8. The semiconductor structure of claim 1, further comprising another field effect transistor located on said substrate and embedded in said planarization dielectric layer, wherein said another field effect transistor comprises:
   another gate dielectric straddling another semiconductor material portion; and
   another work function material layer overlying said another gate dielectric and having a different composition than said work function material layer, wherein said conductive material portion overlying said another work function material layer.

9. The semiconductor structure of claim 1, wherein said work function material layer is laterally spaced from said planarization dielectric layer by a thickness of said gate dielectric.

10. The semiconductor structure of claim 1, wherein said substrate comprises a buried insulator layer and a handle substrate.

11. The semiconductor structure of claim 1, wherein said semiconductor material portion is doped with a p-type dopant or an n-type dopant.

12. The semiconductor structure of claim 1, further comprising a raised source region and a raised drain region, wherein said raised source region is on said source region and said raised drain region in on said drain region.

13. The semiconductor structure of claim 1, wherein said work function material layer is in direct contact with a topmost surface of said gate dielectric.

14. The semiconductor structure of claim 1, wherein said work function material layer comprises a metallic material or a doped semiconductor material.

15. The semiconductor structure of claim 14, wherein said metallic material is selected from the list consisting of Pt, Rh, Ir, Ru, Cu, Os, Be, Co, Pd, Te, Cr, Ni, TiN, and alloys thereof.

16. The semiconductor structure of claim 14, wherein said metallic material is selected from the list consisting of Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof.

17. The semiconductor structure of claim 1, wherein said gate dielectric is in continuous and direct contact with an entire topmost surface of said body region and is in continuous and direct contact with an entire outermost sidewall of said body region.

18. The semiconductor structure of claim 17, wherein said work function material layer is in direct contact an entire topmost surface of said gate dielectric and is in continuous and direct contact with an entire outermost sidewall of said gate dielectric.

* * * * *